(12) United States Patent
Kai et al.

(10) Patent No.: US 7,034,453 B2
(45) Date of Patent: Apr. 25, 2006

(54) ORGANIC EL DISPLAY DEVICE WITH ARRANGEMENT TO SUPPRESS DEGRADATION OF THE LIGHT EMITTING REGION

(75) Inventors: Kazuhiko Kai, Mobara (JP); Masaaki Okunaka, Mobara (JP); Naoyuki Ito, Chiba (JP)

(73) Assignee: Hitachi Displays, Ltd., Mobara (JP)

( * ) Notice: Subject to any disclaimer, the term of this patent is extended or adjusted under 35 U.S.C. 154(b) by 47 days.

(21) Appl. No.: 10/732,278

(22) Filed: Dec. 11, 2003

(65) Prior Publication Data
US 2004/0119419 A1 Jun. 24, 2004

(30) Foreign Application Priority Data
Dec. 11, 2002 (JP) ............................. 2002-358983

(51) Int. Cl.
*H01J 1/62* (2006.01)
(52) U.S. Cl. ...................... 313/504; 313/503; 313/506; 313/509
(58) Field of Classification Search ................ 313/504, 313/503, 506, 509, 505; 315/169.3, 169.4
See application file for complete search history.

(56) References Cited

U.S. PATENT DOCUMENTS

| | | | | |
|---|---|---|---|---|
| 6,844,672 | B1 * | 1/2005 | Yamazaki | 313/504 |
| 6,888,304 | B1 * | 5/2005 | Sato | 313/498 |
| 2003/0080338 | A1 * | 5/2003 | Yamazaki et al. | 257/59 |
| 2004/0195964 | A1 * | 10/2004 | Yamazaki et al. | 313/504 |

\* cited by examiner

*Primary Examiner*—Tuyet Thi Vo
(74) *Attorney, Agent, or Firm*—Antonelli, Terry, Stout and Kraus, LLP.

(57) ABSTRACT

In an organic EL display device comprising a substrate, a plurality of pixel regions in each of which a first electrode, a light emitting material layer, and a second electrode are laminated in this order above the substrate, and a bank film formed above the substrate to separate respective one of the pixel regions from another of the pixel regions adjacent thereto, wherein the bank film has a plurality of openings exposing upper surfaces of the first electrodes to the light emitting material layers in the respective pixel regions, and the second electrode is formed over the a plurality of openings of the bank film in common with the pixel regions, the present invention forms the bank film of an inorganic material and shapes a side wall thereof lying around each of the openings thereof to be sloped at an angle less than 85 degrees (°) with respect to a principal surface of the substrate in order to prevent the deterioration of the light emitting material layer and disconnection of the second electrode at steps of bank film lying in the vicinity of the openings thereof.

12 Claims, 5 Drawing Sheets

Altered Part
(Non-Luminescent Area)

ORGANIC EL DISPLAY DEVICE WITH ARRANGEMENT TO SUPPRESS DEGRADATION OF THE LIGHT EMITTING REGION

BACKGROUND OF THE INVENTION

1. Field of the Invention

The present invention relates to an organic EL (Electro-Luminescence) display device.

2. Description of the Related Art

An organic EL display device is constituted such that on each pixel region of a substrate, at least one electrode (for example an anode), a light emitting material layer (or a plurality of organic material layers including the light emitting material layer) and another electrode (for example, a cathode) are formed in a laminated manner. A plurality of these pixel regions are arranged two-dimensionally on the substrate so as to form a display region (an effective display region) which displays images. In each of a plurality of pixel regions, one of a pair of electrodes (for example, the above-mentioned anode and cathode) which sandwich the light emitting material layer may be formed as a common electrode which spreads over a plurality of pixel regions.

In each of the above-mentioned pixel regions, due to an electric current which flows from one of the pair of electrodes which sandwich the light emitting material layer to another of the pair of electrodes through the light emitting material layer, the light emitting material layer is made to emit light and hence, an image is displayed on the display region.

In the organic EL display device, the light emitting material layer is formed of organic material and hence, the light emitting material layer is liable to suffer from the degradation due to moisture or the like. Accordingly, in forming the light emitting material layer, a selective etching method based on a photolithography technique cannot be used. In a manufacturing process of the organic EL display device having the light emitting material layer made of low-molecular-system organic material, in place of the selective etching method, for example, using a vapor deposition shadow mask, light emitting material (organic material) which is vaporized by sublimation or the like is selectively adhered to given positions thus forming (sublimating) a light emitting material layer in a given pattern.

In the manufacturing step of the organic EL display device, a selective etching method which uses an etchant after forming the light emitting material layer cannot be utilized and hence, it is necessary to provide a structural body which insulates a pair of laminated electrodes at both sides of the light emitting material layer in the pixel region before forming the light emitting material layer. To cope with such a request, there has been known a technique in which an insulation film (a bank film) in which a recessed portion is formed is preliminarily formed at portions where the light emitting material layer is formed.

In this case, one electrode (hereinafter referred to as pixel electrode) is formed as a layer below the light emitting material layer and another electrode (hereinafter referred to as a counter electrode) is commonly formed on respective pixel regions and hence, the counter electrode is usually formed such that the counter electrode covers the light emitting material layer and the surface of the bank film (see Japanese Unexamined Patent Publication Heill (1999)-329741).

Conventionally, as the bank film, an organic material layer (for example, made of resin) which can be easily formed is generally used. The bank film made of the organic material is formed with a thickness (layer thickness) of approximately 1 µm. On the other hand, a method which forms the bank film using the inorganic material has been proposed (see Japanese Unexamined Patent Publication 2001-68267).

SUMMARY OF THE INVENTION

However, in the organic EL display device (also referred to as Organic Electroluminescent Display Device or OLED (Organic Light-Emitting Diode) Display) having the bank film made of organic material, a non-light emitting region has often appeared at an end portion of the pixel.

Inventors of the present invention have pursued a cause of this phenomenon and have found that moisture, oxygen or the like contained in the bank film made of organic material is relevant to the above-mentioned degradation of pixels (the occurrence of non-light-emitting region). When the bank film made of the organic material has an interface which comes into contact with a light emitting material layer (an organic material layer which exhibits an electroluminescence phenomenon), moisture, oxygen and the like contained in the bank film are diffused into the light emitting material layer from the interface. The light emitting material layer (organic material layer), due to the unexpected diffusion of moisture, oxygen and the like in the inside thereof, inevitably receives the change of electron state and loses desirable electric field light-emitting characteristics.

Since the degradation of the light emitting material layer is remarkable in the vicinity of the interface with the bank film where a diffusion quantity of moisture, oxygen and the like is large, the above-mentioned non-light-emitting region (also referred to as the non-light-emitting portion or the dark spot) is formed at an end portion of the pixel (the light emitting region formed of the above-mentioned organic material) which is brought into contact with the bank film. With respect to such a drawback, it is unavoidable that any organic material which is used as the bank material contains approximately 0.1% of water content. Accordingly, so long as the bank film is formed of the organic material, it is difficult to prevent the occurrence of the non-light-emitting region at the end portion of the pixel which constitutes the organic EL element. Further, even when an electron-transporting layer or a hole-transporting layer is formed between the bank film and the light emitting material layer, this does not solve this drawback.

On the other hand, the bank film made of inorganic material exhibits an extremely small quantity of moisture, oxygen or the like contained in the bank film compared to the bank film made of the organic material and hence, such a bank film is considered to be preferable to suppress the occurrence of the above-mentioned non-light emitting region at the end portion of the pixel. However, the inventors of the present invention have also found the occurrence of the non-light emitting region at the end portion of the pixel even with respect to the organic EL display device having the bank film formed of the inorganic material. The inventors have focused their attention on a shape of the bank film as a cause which generates such a drawback even with respect to the organic EL display device provided with the bank film made of inorganic material.

The bank film made of the organic material has a so-called trapezoidal cross section in which side walls of the bank film make an inclined face with respect to a background layer thereof or a principal surface of the substrate on which the background layer or an EL array (Electroluminescent Array)

is formed. An angle with which the side walls of the bank film which are inclined make with respect to the background layer or the principal surface of the substrate (hereinafter referred to as a taper angle) is in a range of 30 to 70 degrees. Accordingly, the light emitting material layer and the counter electrode are not disconnected at a stepped portion between the end portion of the bank film or an upper surface of the pixel electrode and an upper surface of the bank film. That is, the light emitting material layer and the counter electrode are stacked such that they extend from an upper surface of the pixel electrode to an upper surface of the bank film along the inclined surfaces of the bank film.

On the other hand, the side walls of the bank film made of inorganic material erect at an angle of approximately 90 degrees with respect to the background layer (or the principal surface of the substrate). Accordingly, due to a steep stepped portion which is formed between the upper surface of the pixel electrode and the upper surface of the bank film, the light-emitting material layer or the counter electrode (conductive layer) which extends from the upper surface of the pixel electrode to the upper surface of the bank film becomes thin or is disconnected at an end portion (a portion where these layers get over the stepped portion) of the pixel. In other words, the light emitting material layer or the counter electrode is not sufficiently stacked on the end portion of the bank film which is formed like an upright wall. A defect in the layer (film) formation at the stepped portion is also referred to as film thickness loss, stepped disconnection or a step fault.

When the light emitting material layer is stacked from the upper surface of the pixel electrode to the upper surface of the bank film formed on the end portion of the pixel electrode and, thereafter, the counter electrode layer (conductive layer) is stacked to cover the light emitting material layer, the above-mentioned film thickness loss or step disconnection occurs in the light emitting material layer at the stepped portion between the bank film and the pixel electrode which is formed as ascending abruptly from the upper surface of the pixel electrode. When the conductive layer which constitutes the counter electrode is stacked on the light emitting material layer having such an incomplete shape, the film thickness loss or the step disconnection occurs also with respect to the counter electrode. Accordingly, at a stage that an EL array (a pixel array of the display device) is completed on the principal surface of the substrate, the light emitting material layer is not sufficiently covered with the counter electrode and hence, moisture, oxygen and the like which are contained in the atmosphere of the substrate of the EL array intrude and diffuse into the light emitting material layer through the film thickness loss portion or the step disconnection portion which are formed in the counter electrode. As a result, in the same manner as the organic EL display device having the bank film made of the organic material, the non-light-emitting region is formed at the end portion of the pixel (portion where the step disconnection of the counter electrode occurs) even with respect to the organic EL display device having the bank film made of inorganic material.

Further, there exists a possibility that the film thickness loss or the step disconnection which occurs in the light emitting material layer makes the pixel electrode and the counter electrode which are to be spaced apart by the light emitting material layer come abnormally close to each other thus bringing them into a short-circuit. Accordingly, there also exists a possibility that an electric field is concentrated on the end portion of the pixel thus generating leaking of an electric current. In an extreme case, there exists a possibility that a cavity is formed in the light emitting material layer or the light emitting material layer is carbonized due to Joule heat generated by such concentration of electric field strength or leaking of an electric current.

The present invention has been made in view of the above-mentioned circumstances and it is an object of the present invention to provide an organic EL display device which suppresses the degradation of the light emitting region which is attributed to a bank film and, at the same time, can suppress the failure in formation of a counter electrode and a light emitting material layer and the failure in image display.

To briefly explain the summary of representative inventions among the inventions disclosed in this specification, they are as follows.

Means 1

One of exemplified organic EL display devices according to the present invention (the means 1) comprising:

(1) a substrate;

(2) a plurality of pixel regions each of which has at least a first electrode, a light emitting material layer, and a second electrode laminated in this order above a principal surface of the substrate, the plurality of pixel regions are arranged two-dimensionally in the principal surface of the substrate; and (3) a bank film formed above the principal surface of the substrate to separate respective one of the plurality of pixel regions from another of the plurality of pixel regions adjacent to the respective one of the plurality of pixel regions, the bank film has openings each of which exposes the first electrode provided for the respective one of the plurality of pixel regions, wherein (4) the light emitting material layer is formed in the opening of the bank film to be extended to a side wall of the bank film lying along the opening in the respective one of the plurality of pixel regions, (5) the second electrode provided for the respective one of the plurality of pixel regions is formed in common with that provided for the another of the plurality of pixel regions, and (6) the bank film is constituted of at least one inorganic material layer and has the side wall thereof sloped at an angle less than 85 degrees (°) with respect to the principal surface of the substrate.

The slope angle less than 85 degrees of the side wall of the bank film may also defined with respect to an upper surface of the first electrode in contact with the bank film instead of the principal surface of the substrate as defined the item (6) described above.

Means 2

Another of exemplified organic EL display devices according to the present invention (the means 2) comprising:

(1) a substrate; and (7) a plurality of pixel regions arranged in a principal surface of the substrate, respective one of the plurality of pixel regions has a first electrode, a bank film, a light emitting material layer, and a second electrode stacked in this order above the principal surface of the substrate, wherein (8) the bank film spaces the first electrode provided for the respective one of the plurality of pixel regions from that provided for another of the plurality of pixel regions adjacent to the respective one of the plurality of pixel regions, (9) the second electrode is formed in common with the plurality of pixel regions, (10) the bank film has an opening exposing a part of an upper surface of the first electrode toward the light emitting material layer and a side wall located along the opening,
(11) the light emitting material layer is formed in the opening of the bank film and in the vicinity thereof, and
(6) the bank film is constituted of at least one inorganic material layer and has the side wall thereof inclined at an angle less than 85 degrees (°) with respect to the principal surface of the substrate.

The inclination angle less than 85 degrees of the side wall of the bank film may also defined with respect to an upper surface of the first electrode in contact with the bank film instead of the principal surface of the substrate as defined the item (6) described above.

Means 3

In an organic EL display devices according to the present invention including the constitution defined by the means 2, the light emitting material layer provided for the respective one of the plurality of pixel regions is overlapped with the other light emitting material provided for the another of the plurality of pixel regions on a surface of the bank film. If one of the plurality of pixel regions and another thereof adjacent to the one thereof radiate light having the same color, the light emitting material layer may be formed in common with the one thereof and the another thereof by extending the light emitting material layer from the one thereof to the another thereof.

Means 4

In an organic EL display devices according to the present invention including the constitution defined by either one of the means 1, the means 2, and the means 3, the bank film is formed of a silicon nitride film ($SiN_x$).

Means 5

In an organic EL display devices according to the present invention including the constitution defined by the means 4, a composition ratio of nitrogen x of the silicon nitride film ($SiN_x$) is different between a lower side of the silicon nitride film located closer to the principal surface of the substrate and an upper side thereof further from the principal surface of the substrate opposed to the lower side thereof to decrease an etching rate thereof at the lower side thereof in comparison with that at the upper side thereof.

Instead of the means 5 described above, the silicon nitride film may formed of a plurality of layers laminated above the principal surface of the substrate, so that composition ratio of nitrogen x in the plurality of layers is different from each other to decrease an etching rate of the silicon nitride film as closer to the principal surface of the substrate in an organic EL display devices according to the present invention including the constitution defined by the means 4.

Means 6

In an organic EL display devices according to the present invention including the constitution defined by either one of the means 1 and the means 2, the side wall of the bank film is shaped into a curvature extended from an upper surface of the first electrode to an upper surface of the bank film.

Means 7

In an organic EL display devices according to the present invention including the constitution defined by either one of the means 1, the means 2, and the means 6, the side wall of the bank film is partially sloped at an angle not less than 85 degrees with respect to the principal surface of the substrate between an upper surface of the first electrode to an upper surface of the bank film. In other words, the side wall of the bank film may meet the principal surface of the substrate at an angle equal to or greater than 85 degrees (°) partially as long as a part thereof meets the principal surface of the substrate at an angle less than 85 degrees. In the organic EL display devices including the constitution defined by the means 6, a tangent or a tangent plane contacting a part of the curvature (the side wall of the bank film) may meet the principal surface of the substrate at an angle equal to or greater than 85 degrees on condition that another tangent or another tangent plane contacting another part of the curvature (other than the part thereof) meets the principal surface of the substrate at an angle less than 85 degrees. The principal surface of the substrate meeting either one of the side wall of the bank film, the tangent in contact therewith, and the tangent plane in contact therewith may be replaced with an upper surface of the first electrode in contact with the bank film.

Means 8

In an organic EL display devices according to the present invention comprising a plurality of gate signal lines and a plurality of drain signal lines both formed on the principal surface of the substrate as well as the constitution defined by either one of the means 1 and the means 2, the respective one of plurality of pixel regions has a switching element which receives a video signal from one of the plurality of drain signal lines while the switching element is turned on by a scanning signal transmitted by one of the plurality of gate signal lines, and a current in accordance with the video signal flows between the first electrode and the second electrode through the light emitting material layer in the respective one of plurality of pixel regions.

Means 9

In an organic EL display devices according to the present invention including the constitution defined by the means 8, the second electrode is formed also over an upper surface of the bank film in common with the plurality of pixel regions, and a reference signal to the video signal is supplied to the second electrode.

Here, the present inventions are not limited to the above-mentioned constitutions and various modifications are conceivable without departing from the technical concept of the present invention.

DETAILED DESCRIPTION

Embodiments of an organic EL display device according to the present invention are explained in conjunction with the drawings.

Embodiment 1.

<<Equivalent Circuit of the Display Part>>

Figure 2:
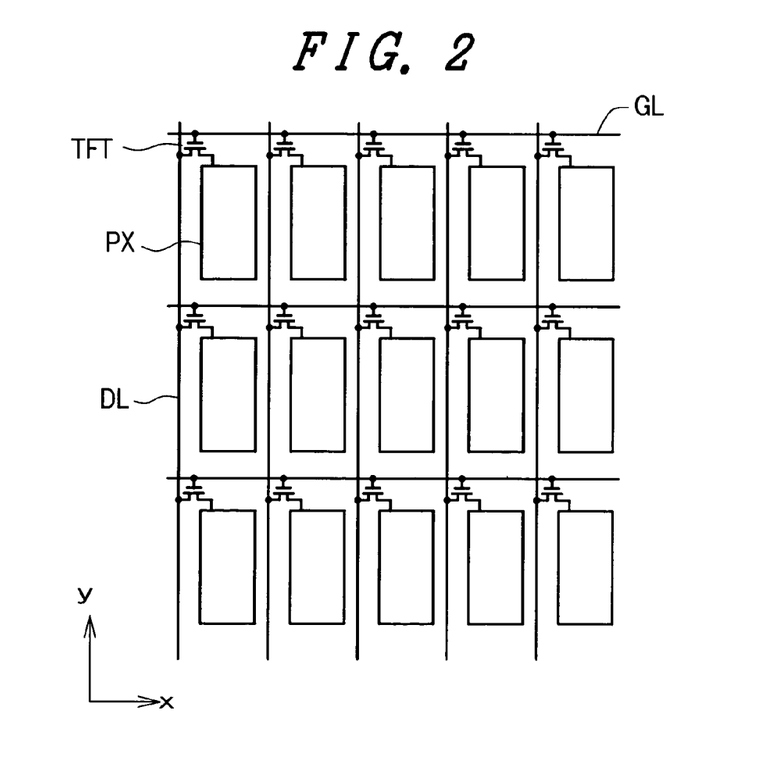
FIG. 2 is an equivalent circuit diagram showing one embodiment of a display part of an organic EL display device according to the present invention.

FIG. 2 is an equivalent circuit diagram of one embodiment of the organic EL display device according to the present invention.

In the drawing, gate signal lines GL which extend in the x direction in the drawing and are arranged in parallel in the y direction in the drawing and drain signal lines DL which extend in the y direction in the drawing and are arranged in parallel in the x direction in the drawing are formed.

Respective rectangular regions which are surrounded by these gate signal lines GL and drain signal lines DL constitute pixel regions and a mass of these pixel regions form a display region.

Each pixel region includes a thin film transistor TFT which is turned on in response to a scanning signal from the one-side (upper side in the drawing) gate signal line GL and a pixel electrode PX to which a video signal is supplied from the one-side (left side in the drawing) drain signal line DL by way of the thin film transistor TFT. In a current-drive type organic EL display device which makes the pixel emit light by re-coupling an electron and a hole in a light emitting material layer, the video signals are supplied as current signals. Further, a current supply line not shown in FIG. 2 may be formed on a substrate and thin film transistors for supplying a current which are controlled in response to video signals may be newly formed in respective pixel regions, and a given current may be supplied to pixel electrodes through the thin film transistors for supplying a current from the current supply line in response to a voltage of the video signal.

The pixel electrode PX is configured to sandwich a light emitting material layer between the pixel electrode PX and a counter electrode not shown in the drawing, and the light emitting material layer is made to emit light in response to a current which flows between the pixel electrode PX and the counter electrode.

Here, the counter electrode is formed commonly with respect to respective pixel regions and supplies a signal which becomes the reference with respect to the video signal.

In such a constitution, the display device is driven such that one of respective gate signal lines GL is selected one after another in response to the supply of the scanning signal, while the video signal is supplied to respective drain signal lines DL at the selection timing of the gate signal line GL.

<<Constitution of Pixel>>

Figure 1:
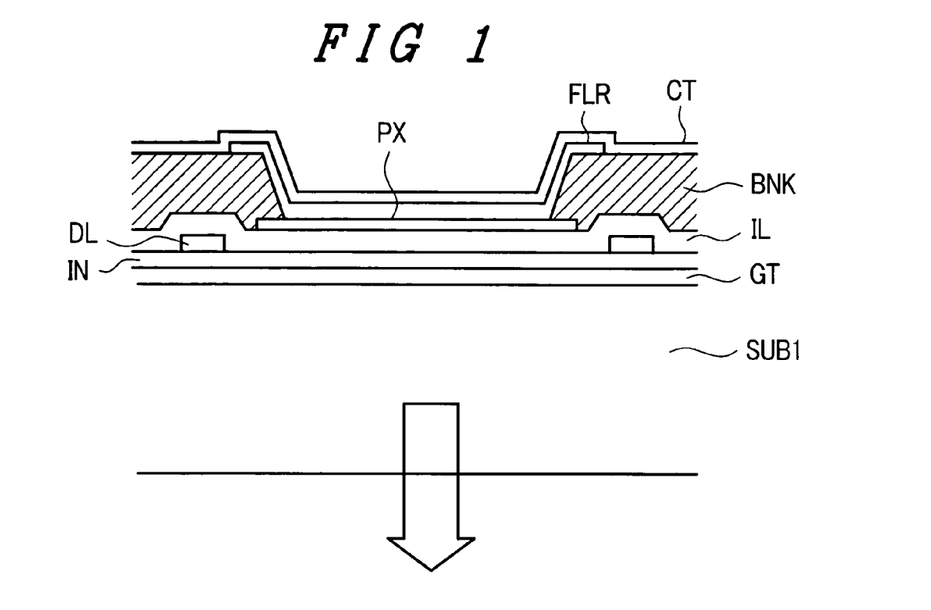
FIG. 1 is a cross-sectional view showing one embodiment of a pixel of an organic EL display device according to the present invention and also is a cross-sectional view taken along a line I—I in FIG. 3.
Figure 3:
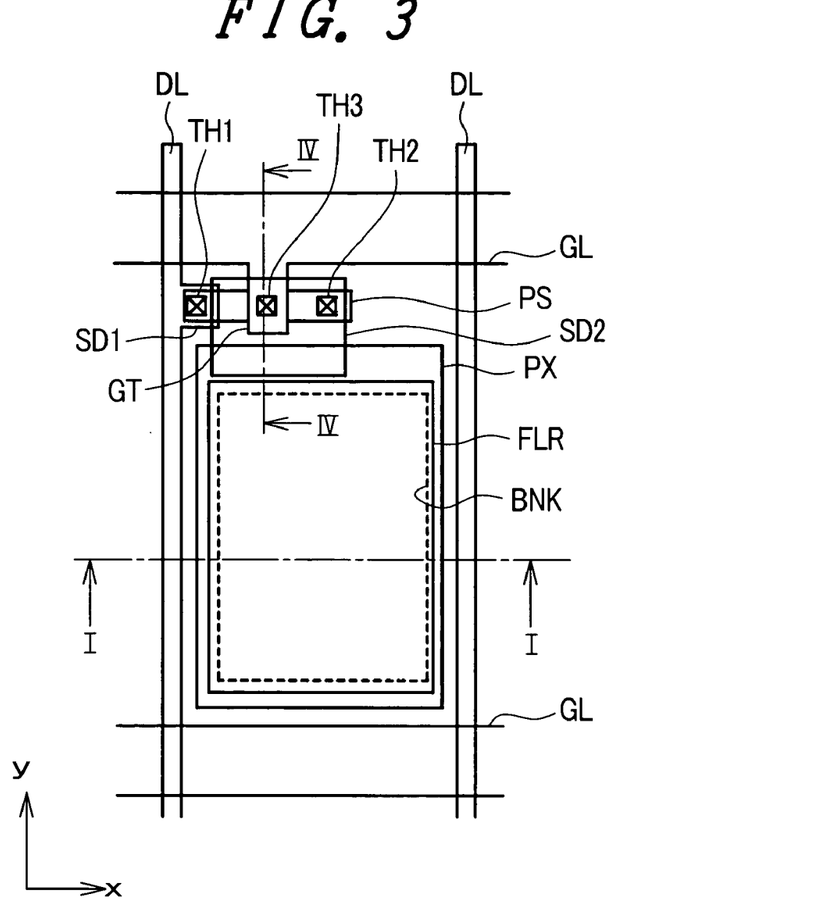
FIG. 3 is a plan view showing one embodiment of a pixel of an organic EL display device according to the present invention.
Figure 4:
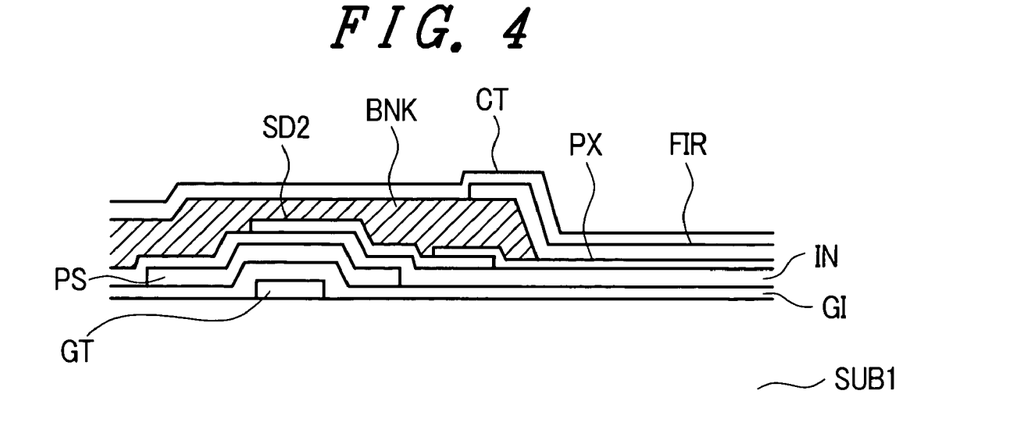
FIG. 4 is a cross-sectional view taken along a line IV—IV in FIG. 3.

FIG. 3 is a plan view showing one embodiment of the above-mentioned pixel. Further, a cross section taken along a line I—I in FIG. 3 is shown in FIG. 1 and a cross section taken along a line IV—IV in FIG. 3 is shown in FIG. 4.

In FIG. 3, for example, at a left upper portion of each pixel region on a surface of the substrate SUB1 (see FIG. 1 and FIG. 4) made of glass, for example, a semiconductor layer PS formed of a polysilicon layer which extends in the x direction in the drawing is formed. The semiconductor layer PS constitutes a semiconductor layer of the thin film transistor TFT.

Then, an insulation film GI (see FIG. 1 and FIG. 4) is formed on the surface of the substrate SUB1 such that the insulation film GI also covers the semiconductor layer PS. The insulation film GI functions as a gate insulation film in a region where the thin film transistor TFT is formed.

On a surface of the insulation film GI, the gate signal lines GL which extend in the x direction and are arranged in parallel in the y direction are formed. The gate signal lines GL are formed such that the gate signal lines GL define the pixel regions together with the drain signal lines DL explained later.

Further, an extending portion which extends such that a portion thereof traverses a substantially center portion of the semiconductor layer PS is formed on the gate signal line GL. The extending portion functions as a gate electrode GT of the thin film transistor TFT.

Here, after formation of the gate electrode GT, impurity ions are injected using the gate electrode GT as a mask so that portions of the semiconductor layer PS in the regions other than a region immediately below the gate electrode GT are made less resistant.

An insulation film IN (see FIG. 1, FIG. 4) is formed on the surface of the substrate SUB1 such that the insulation film IN also covers the gate signal lines GL (gate electrodes GT). This insulation film IN functions as an interlayer insulation film with respect to the gate signal line GL in the region for forming the drain signal line DL explained next.

On a surface of the insulation film IN, the drain signal lines DL which extend in the y direction and are arranged in parallel in the x direction are formed. A portion of the drain signal line DL extends to one end portion of the semiconductor layer PS and is connected to the semiconductor layer PS via a through hole TH1 which is preliminarily formed by penetrating the insulation film IN and the insulation film GI. That is, the extending portion of the drain signal line DL functions as a drain electrode SD1 of the thin film transistor TFT.

Further, in another end portion of the semiconductor layer PS, a source electrode SD2 which is connected via a through hole TH2 which is preliminarily formed by penetrating the insulation film IN and the insulation film GI is formed. The source electrode SD2 is provided with an extending portion for connecting the source electrode SD2 with the pixel electrode PX described later.

Then, on a surface of the substrate SUB1 on which the drain signal lines DL (drain electrodes SD1) and source electrodes SD2 are formed in such a manner, an insulation film IL (see FIG. 1 and FIG. 4) is formed.

On an upper surface of the insulation film IL, the pixel (anode) electrode PX is formed at the center except for a trivial periphery in each pixel region and the pixel electrode PX has a portion thereof connected to the above-mentioned extending portion of the source electrode SD2. Here, the pixel electrode PX is, for example, formed of a light transmitting conductive film such as ITO (Indium Tin Oxide). This provision is made to allow light from the light emitting material layer FLR described later to pass through the pixel electrode PX toward the substrate SUB1 side.

On an upper surface of the pixel electrode PX, the light emitting material layer FLR is formed. The light emitting material layer FLR contains a fluorescent organic material which emits light by applying a given voltage such as quinolinol complex, oxazole complex, various laser pigments, polyparaphenylene vinylene or the like.

Further, the light emitting material layer FLR may be formed, if necessary, by laminating a hole transporting layer which has a function of efficiently transporting holes injected from the electrode to the light emitting material layer or the like.

In this specification, even when the light emitting material layer FLR is formed by laminating a hole importing layer, an electron injecting layer or the like besides the light emitting material layer, such a combination is also referred to as the light emitting material layer FLR in a form that the light emitting material layer FLR includes these layers.

Here, although the light emitting material layer FLR is formed (filled) such that the light emitting material layer FLR is defined from other neighboring light emitting material layer FLR by a bank (partition wall) film BNK, the light emitting material layer FLR is formed such that the light emitting material layer FLR covers an opening portion (portion where the pixel electrode PX is exposed) in the bank film BNK, reaches a side wall portion of the bank film BNK and extends over a surface portion of the bank film BNK. In other words, the light emitting material layer FLR is formed such that the light emitting material layer FLR covers the opening portion of the bank film BNK and, at the same time, reaches the periphery of the opening portion.

This provision is made to preliminarily ensure the large tolerance to cope with the displacement of the mask (vapor deposition shadow mask) in forming the light emitting material layer FLR. Accordingly, it is possible to obtain an advantageous effect that alignment of the mask can be easily performed.

Here, in this case, it is needless to say that the light emitting material layer FLR of the pixel region and the light emitting material layer of the another pixel region which is disposed close to the pixel region form a portion where they are superposed each other.

This is because that the tolerance against the mask displacement at the time of forming the light emitting material layer FLR can be further increased and hence, the distance between the pixels can be narrowed whereby the display of high definition can be realized.

Here, the bank film BNK is formed of an inorganic material layer made of, for example, $SiN_x$, $SiO_2$ or the like and the side wall in the opening thereof is formed to have an inclination which flares toward the light emitting material layer FLR side. Here, the inclination is set to less than 85 degrees, and more preferably, to 80 to 10 degrees. Advantageous effects obtained by the material of the bank film BNK and the inclination of the side wall are explained in detail later.

A layer thickness of the light emitting material layer FLR is set thinner than a layer thickness of the bank film BNK and hence, the light emitting material layer FLR is formed with a stepped portion at a position of the side wall in the opening portion formed in the bank film BNK.

On the upper surfaces of the light emitting material layer FLR and the bank film BNK, a counter (cathode) electrode CT which is used in common by respective pixel regions is formed using aluminum or the like, for example. In this case, the counter electrode CT is also formed with a stepped portion at a position of the side wall in the opening portion formed in the bank film BNK.

Then, to an upper surface of the counter electrode CT, the substrate SUB2 made of glass, for example, is laminated by way of a high molecular resin seal PSL, for example.

By supplying an electric current to the light emitting material layer FLR interposed between the pixel electrode PX and the counter electrode CT, the light emitting material layer FLR emits light and this light LT can be observed with naked eyes through the pixel electrode PX and the substrate SUB1.

Here, a voltage signal which becomes the reference with respect to the video signal is applied to the counter electrode CT, while the video signal is applied to the pixel electrode PX from the drain signal line DL through the thin film transistor TFT. Further, the thin film transistor TFT is switched on in response to the scanning signal from the gate signal line GL.

<<Comparison of Shape and Material of Bank Film>>

Figure 5A:
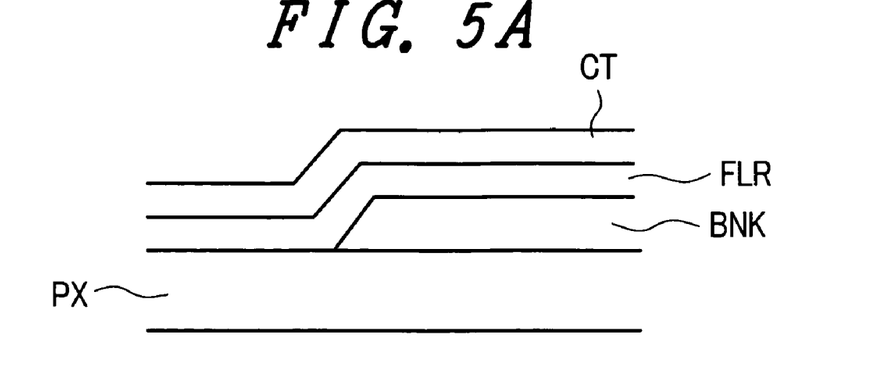
FIG. 5A to FIG. 5C are explanatory views showing an advantageous effect of the organic EL display device according to the present invention.

As described above, with respect to the bank film BNK which defines the substantial pixel region, as shown in FIG. 5A, a side wall having a gentle inclination is formed at the center side of the pixel region and hence, the light emitting material layer FLR and the counter electrode CT which are formed thereafter can be formed respectively such that no step disconnection is generated at respective side walls thereof.

Figure 5B:
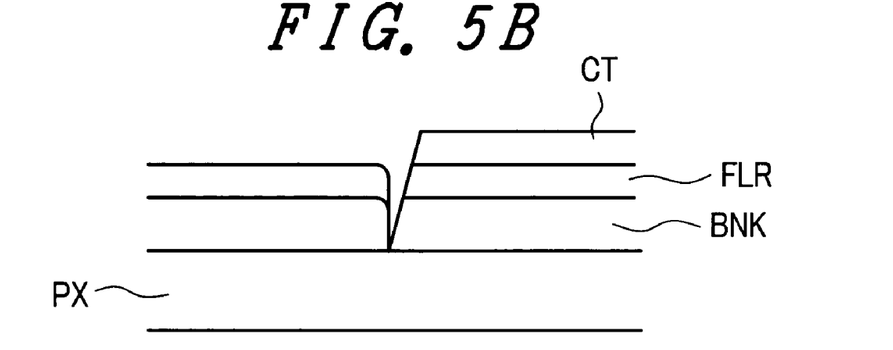

FIG. 5B shows a cross section of a bank film BNK which is formed of inorganic material and has a stepped portion close to 90 degrees. This FIG. 5B is also an explanatory view of one comparison example for the cross section of the bank film BNK of the present invention shown in FIG. 5A. A side wall of the bank film BNK shown in FIG. 5B erects at an angle (inclination angle) which is close to perpendicular with respect to a surface of the pixel electrode PX (background layer of the bank film BNK) and hence, it is difficult to stack the light emitting material layer FLR on the side wall whereby the disconnection portion (step disconnection) of the light emitting material layer FLR is generated in a valley shape at an end portion of the bank film BNK. Such step disconnection of the light emitting material layer FLR is succeeded by the shape of the counter electrode CT formed on the upper surface of the light emitting material layer FLR. Accordingly, there exists a large probability that the film thickness loss or the step disconnection will be generated in the counter electrode CT at a portion of the light emitting material layer FLR where the step disconnection is formed or the vicinity thereof.

To observe one pixel in the plan structure (see FIG. 3, for example), the step disconnection of the light emitting material layer FLR or the counter electrode CT which occurs at an extremely limited portion of the end portion of the pixel (for example, a profile of the bank film BNK indicated by a broken line in FIG. 3) (a so-called local step disconnection) does not cause any trouble in supplying an electric current to the light emitting material layer FLR (in other words, the image display operation of the organic EL display device) and hence, such step disconnection can be ignored. However, along with the continuation of driving of the organic EL display device (supplying of an electric current to the light emitting material layer FLR), the electric current to be supplied to the light emitting material layer FLR is concentrated between the counter electrode CT and the pixel electrode PX which can no more ensure the sufficient spacing due to the step disconnection or the film thickness loss of the light emitting material layer FLR. When the electric current is locally concentrated on the portion of the light emitting material layer FLR where the step disconnection or the film thickness loss is generated (hereinafter referred to as a defective region of the light emitting material layer FLR), the Joule heat is generated in such a portion and hence, the light emitting material layer FLR is evaporated around this defective region thus forming cavities or carbonizing the organic compound which constitutes the light emitting material layer FLR.

Further, in the portion of the counter electrode CT where the step disconnection or the film thickness loss is generated (hereinafter referred to as the defective region of the counter electrode CT), moisture, oxygen or the like which is contained in the atmosphere (that is, remaining in a sealing cap) intrudes into the light emitting material layer FLR through the defective region of the counter electrode CT. In other words, the defective region of the counter electrode CT constitutes an inlet which allows the moisture, oxygen or the like to intrude into the light emitting material layer FLR. Accordingly, the moisture, oxygen or the like which intrudes into an extremely limited region of the light emitting material layer FLR (the vicinity of the end portion of the pixel) degenerates the light emitting material layer FLR which is positioned at the end portion of the pixel whereby the non-light emitting region is formed. Further, the moisture, oxygen or the like which intrudes into the light emitting material layer FLR diffuses into the inside of the light emitting material layer FLR in response to the supply of an electricity to the light emitting material layer FLR thus spreading the non-light emitting region in the inside of the layer.

Figure 5C:
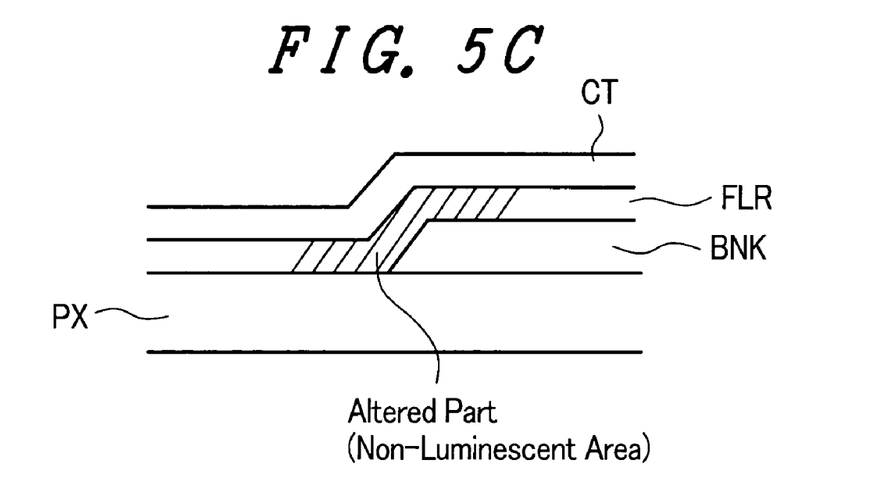

FIG. 5C shows a cross section of a bank film BNK which is formed of organic material. FIG. 5C is also an explanatory view of another comparison example for the cross section of the bank film BNK of the present invention shown in FIG. 5A. Since the organic material layer which constitutes the bank film BNK contains the moisture, oxygen or the like, the moisture, oxygen or the like intrudes into the light emitting material layer FLR which is in contact with the bank film BNK through a contact interface between the light emitting material layer FLR and the bank film BNK and diffuses in the inside of the light emitting material layer FLR. Accordingly, compared to the local generation of the non-light emitting region explained in conjunction with FIG. 5B, in the structure shown in FIG. 5C which uses the bank film BNK made of the organic material, the light emitting material layer FLR is degraded along the above-mentioned contact interface and the non-light emitting region spreads along the end portion of the pixel.

As can be clearly understood from the above-mentioned two comparison examples, in the structure of this embodiment shown in FIG. 5A, (1) by forming the bank film BNK using the inorganic material such as $SiN_x$, $SiO_2$ or the like, the degradation of the light emitting material layer FLR which is in contact with the bank film BNK can be prevented.

Further, in the structure of this embodiment, (2) to prevent the step disconnection or the film thickness loss of the light emitting material layer FLR at the end portion of the pixel where the bank film BNK is formed and the step disconnection or the film thickness loss of the counter electrode CT attributed to the step disconnection or the film thickness loss of the light emitting material layer FLR, an inclination angle (taper angle) of the side wall of the bank film BNK with respect to the pixel electrode PX (or a background layer, a principal surface of a substrate SUB1 as shown in FIG. 1) is limited to a value less than 85 degrees. By reference to the planar structure of the pixel shown in FIG. 3, the inclination angle of the side wall of the bank film BNK can be also expressed as an inclination angle with respect to the pixel electrode PX (conductive layer) of the side wall of the opening portion for exposing the pixel electrode PX.

Here, by forming the bank film BNK using the inorganic material layer, it is possible to decrease a film thickness "t" of the bank film BNK and hence, an advantageous effect that a stray light (smear) to the pixel region from other pixel region which is arranged close to the pixel region can be also reduced.

Here, when the bank film BNK is formed of the organic material layer, a film thickness of the bank film BNK becomes approximately 1 μm and this gives rise to a drawback such as lowering of contrast due to the stray light (smear).

To consider the film thickness "t" of the bank film BNK which is formed of the inorganic material layer, assuming a film thickness of the light emitting material layer FLR as "t1" and a film thickness of the counter electrode CT as "t2", the relationship to $t \approx t1+t2$ is established. It is preferable to establish the relationship to $t<t1+t2$. Further, it is suitable to ensure at least the relationship $\frac{1}{2}t<t1+t2$. By forming the bank film BNK using the inorganic material layer, it is possible to set the film thickness of the bank film BNK in the above-mentioned manner.

<<Manufacturing Method>>

Figure 6:
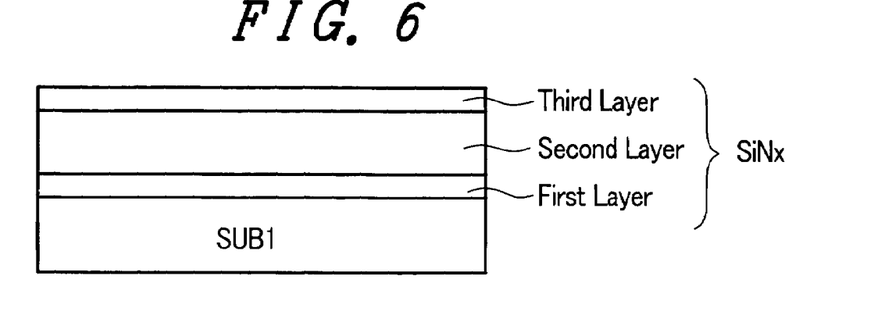
FIG. 6 is a cross-sectional view showing one embodiment of a manufacturing method of the organic EL display device according to the present invention.

FIG. 6 is a view showing one embodiment of a manufacturing method of the bank film BNK.

The pixel electrodes PX (not shown in the drawing) are formed on the surface of the substrate SUB1 made of glass and, thereafter, a silicon nitride film (SiNx), for example, is formed on the surface of the substrate SUB1. In this case, the silicon nitride film has the three-layered structure which is constituted of different layers, for example. That is, the silicon nitride film is sequentially formed such that a silicon nitride film having a low etching rate which constitutes a first layer, a silicon nitride film having an intermediate etching rate which constitutes a second layer, and a silicon nitride film having a fast etching rate which constitutes a third layer are sequentially formed in order from the substrate SUB1 side.

In an example in which the bank film BNK formed of the silicon nitride film having the three-layered structure using a plasma enhanced CVD method, a ratio (flow rate) of a monosilane gas and an ammonium gas which are supplied to a CVD chamber (film forming chamber) is controlled so as to sequentially reduce a ratio of nitrogen (N) which is contained in respective gases in order from the silicon nitride film which constitutes the first layer (principal surface side of the substrate SUB1) toward the silicon nitride film which constitutes the third layer (the light emitting material layer FLR and the counter electrode CT being formed on an upper surface thereof). Further, the third layer may be formed of a silicon film in which impurities are not intentionally included in place of the silicon nitride film. Further, the bank film BNK may be formed of a two-layered silicon nitride film. Further, a nitrogen content of at least one silicon nitride films included in the bank film may be lowered than a silicon content of nitride silicon which satisfies stoichiometric ratio (also expressed as $Si_3N_4$, ... $SiN_x$ (x=1.33). For example, even when the bank film BNK (having the structure in which the bank film BNK is formed by laminating silicon nitride films in two layers) is formed of a first silicon nitride film which is formed on the principal surface side of the substrate SUB1 and has the composition of $SiN_{1.3}$ and a second silicon nitride film which is formed on the first silicon nitride film with a thickness smaller than a thickness of the first silicon nitride film and has the composition of $SiNo_{0.9}$, a side wall of the bank wall BNK is inclined with an angle of less than 85 degrees.

Then, by selectively etching such a laminated film by a photolithography technique, it is possible to form the inclination which flares toward the substrate SUB1 side in the side wall of the opening portion. Further, an angle of inclination (less than 85 degrees) can be obtained by changing the composition of an etchant, for example.

Embodiment 2.

Figure 7A:
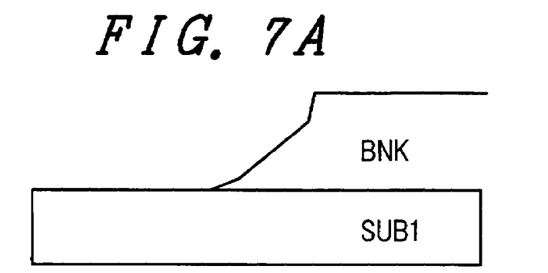
FIG. 7A to FIG. 7C are cross-sectional views of another embodiments of the pixel of the organic EL display device according to the present invention.
Figure 7B:
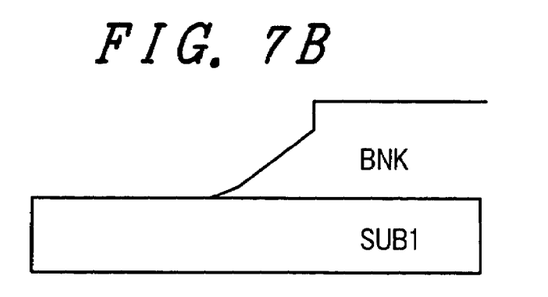
Figure 7C:
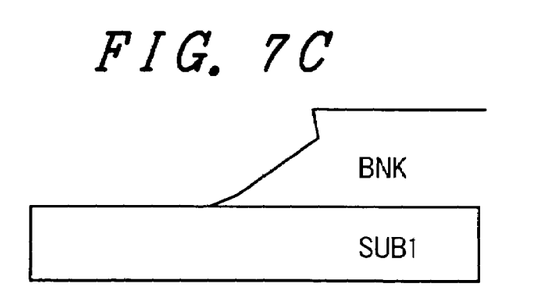

FIG. 7A to FIG. 7C are cross-sectional views respectively showing another embodiments of the side wall of the opening portion of the bank film BNK.

In providing the inclination of less than 85 degrees with respect to the principal surface of the substrate SUB1 (or the upper surface of the pixel electrode PX which is in contact with the bank film BNK as shown in FIG. 1 and FIG. 4) to the opening portion of the bank film BNK, due to conditions of wet etching or the dry etching, there may be a case that the side wall of the bank film BNK makes an angle of 85 degrees or more with respect to the principal surface of the substrate SUB1. In all of FIG. 7A to FIG. 7C, the side wall of the bank film BNK makes an angle of 85 degrees or more with respect to the principal surface of the substrate SUB1 in a region close to an upper surface of the bank film BNK. Further, in FIG. 7C, the side wall of the bank film BNK bends backward toward the opening of the bank film BNK by making an angle close to 100 degrees with respect to the principal surface of the substrate SUB1. However, in all of the side walls of the bank films BNK shown in FIG. 7A to FIG. 7C, between one end of the side wall which is in contact with the principal surface of the substrate SUB1 and another end of the side wall which is close to the upper surface of the bank film BNK, there exists a region where the side wall makes an angle of less than 85 degrees with respect to the principal surface of the substrate SUB1.

In this manner, even when only a portion of the side wall of the bank film BNK makes an angle of less than 85 degrees with respect to the principal surface of the substrate SUB1, it is possible to suppress the probability that the light emitting material layer (organic material layer) FLR and the counter electrode (cathode layer) CT which are formed (stacked) on the bank film BNK are disconnected at the stepped portion between the principal surface of the substrate SUB1 (upper surface of the pixel electrode PX) and the upper surface of the bank film BNK. When the above-mentioned light emitting material layer is formed of a multi-layered film formed of a plurality of organic materials (for example, an electroluminescent material layer and an electron injecting layer and a hole injecting layer which sandwich the electroluminescent material layer), it is preferable to set a region where the side wall of the bank film BNK and the principal surface of the substrate SUB1 (upper surface of the pixel electrode PX) make an angle of less than 85 degrees between the principal surface of the substrate SUB1 (upper surface of the pixel electrode) and the upper surface of the bank film BNK to a half or more of the side wall. In other words, with respect to the side wall rising from the principal surface of the substrate SUB1 to the upper surface of the bank film BNK, it is not necessary to provide an angle which makes less than 85 degrees with respect to the principal surface of the substrate SUB1 to the side wall of the bank film BNK uniformly and it is allowable to partially provide an angle which makes 85 degrees or more with respect to the principal surface of the substrate SUB1 to the side wall.

Accordingly, as shown in FIG. 7A to FIG. 7C respectively, steep inclined surfaces having an angle of approximately 90 degrees or an angle of 90 degrees or more may be partially provided to the side wall from the end portion of the side wall at the substrate SUB1 side to the surface of the bank film BNK. This is because that these steep inclined surfaces have a relatively small height (a ratio with respect to a distance from the principal surface of the substrate SUB1 to the upper surface of the bank film BNK) and hence, the probability that the step disconnection occurs in the conductive layer applied to the portion is extremely small.

That is, it is sufficient that the a portion of the side wall from the end portion of the side wall at the substrate SUB1 side to the surface of the bank film BNK has an inclination angle of less than 85 degrees.

Embodiment 3.

FIG. 8A to FIG. 8D are cross-sectional views respectively showing another embodiments of the side wall of the opening portion of the bank film BNK.

Figure 8A:
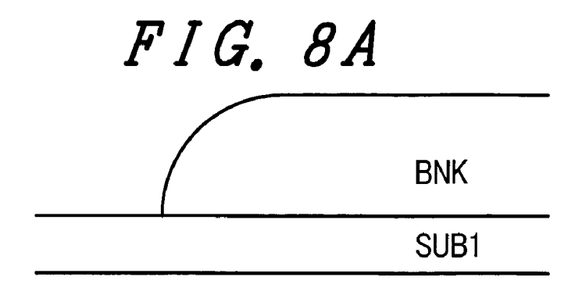
FIG. 8A to FIG. 8D are cross-sectional views of another embodiments of the pixel of the organic EL display device according to the present invention.
Figure 8B:
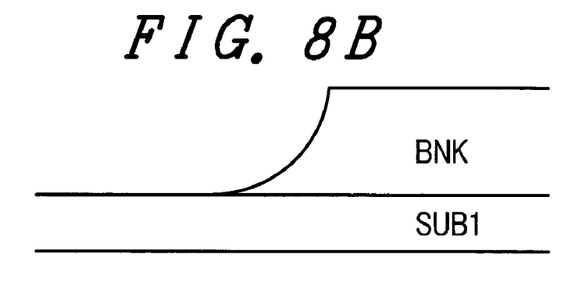
Figure 8C:
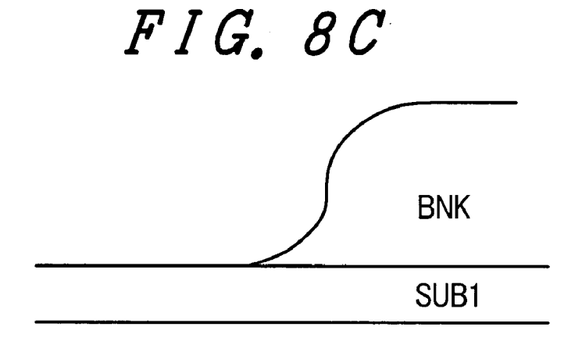
Figure 8D:
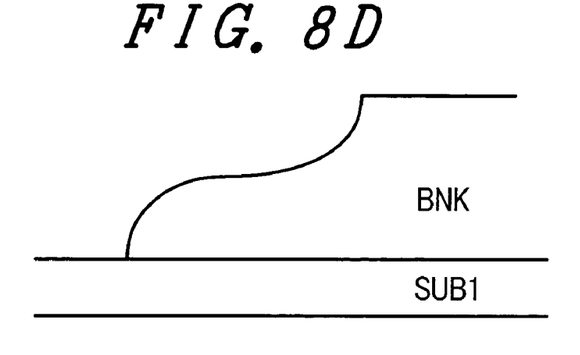

Since the inclined surface of the side wall of the opening portion of the bank film BNK is formed by making use of the difference in the etching rate among respective layers of the bank film BNK as described above, it is a rare case that the side wall is formed as a straight flat face and it is often a case that the side wall is formed in a curved shape as shown in FIG. 8A to FIG. 8D. In FIG. 8A and FIG. 8D, a portion of the side face of the bank film BNK which is in contact with the principal surface of the substrate SUB1 (or a tangent or a contact flat face which is in contact with the portion) makes an angle of 85 degrees or more with respect to the principal surface of the substrate SUB1. In FIG. 8B and FIG. 8D, a portion of the side face of the bank film BNK in the vicinity of the upper surface of the bank film BNK (or a tangent or a contact flat face which is in contact with the portion) makes an angle of 85 degrees or more with respect to the principal surface of the substrate SUB1. In FIG. 8C, a center portion of the side face of the bank film BNK (or a tangent or a contact flat face which is in contact with the portion) makes an angle of 85 degrees or more with respect to the principal surface of the substrate SUB1.

Also in these cases, so long as the side face of the bank film BNK has an inclined surface of less than 85 degrees at a portion thereof from the end portion of the side wall at the substrate SUB1 side to the surface of the bank film BNK (the upper surface covered with an electrode CT and the like), it is possible to suppress the degradation of a light emitting material layer FLR and the rupture of a thin film such as the electrode CT or the like which is stacked in a striding manner over a stepped portion between the principal surface of the substrate SUB1 and the upper surface of the bank film BNK.

Here, in the above-mentioned respective embodiments, although the counter electrode CT is formed of the non-light transmitting conductive layer made of aluminum or the like, it is needless to say that the counter electrode CT may be formed of a light transmitting conductive film such as an ITO film and light from the light emitting material layer FLR is taken out from the counter electrode CT side. In this case, the pixel electrode PX may be formed of a non-light transmitting conductive layer.

As can be clearly understood from the foregoing explanation, according to the organic EL display device of the present invention, it is possible to suppress the step disconnection of the counter electrode.

What is claimed is:

1. The organic EL display device comprising:
   a substrate;
   a plurality of pixel regions each of which has at least a first electrode, a light emitting material layer, and a second electrode laminated in this order above a principal surface of the substrate, the plurality of pixel regions are arranged two-dimensionally in the principal surface of the substrate; and a bank film formed above the principal surface of the substrate to separate respective one of the plurality of pixel regions from another of the plurality of pixel regions adjacent to the respective one of the plurality of pixel regions, the bank film has openings each of which exposes the first electrode provided for the respective one of the plurality of pixel regions, wherein the light emitting material layer is formed in the opening of the bank film to be extended to a side wall of the bank film lying along the opening in the respective one of the plurality of pixel regions, the second electrode provided for the respective one of the plurality of pixel regions is formed in common with that provided for the another of the plurality of pixel regions, and the bank film is comprised of at least one inorganic material layer and has the side wall thereof sloped at an angle less than 85 degrees with respect to the principal surface of the substrate, wherein the bank film is formed of a silicon nitride film ($SiN_x$), wherein a composition ratio of nitrogen x of the silicon nitride film is different between a lower side of the silicon nitride film located closer to the principal surface of the substrate and an upper side thereof further from the principal surface of the substrate opposed to the lower side thereof to decrease an etching rate thereof at the lower side thereof in comparison with that at the upper side thereof.

2. The organic EL display device according to claim 1, wherein the side wall of the bank film is shaped into a curvature extended from an upper surface of the first electrode to an upper surface of the bank film.

3. The organic EL display device according to claim 1, wherein the side wall of the bank film is partially sloped at an angle not less than 85 degrees with respect to the principal surface of the substrate between an upper surface of the first electrode to an upper surface of the bank film.

4. The organic EL display device comprising:

a substrate;

a plurality of pixel regions each of which has at least a first electrode, a light emitting material layer, and a second electrode laminated in this order above a principal surface of the substrate, the plurality of pixel regions are arranged two-dimensionally in the principal surface of the substrate; and a bank film formed above the principal surface of the substrate to separate respective one of the plurality of pixel regions from another of the plurality of pixel regions adjacent to the respective one of the plurality of pixel regions, the bank film has openings each of which exposes the first electrode provided for the respective one of the plurality of pixel regions, wherein the light emitting material layer is formed in the opening of the bank film to be extended to a side wall of the bank film lying along the opening in the respective one of the plurality of pixel regions, the second electrode provided for the respective one of the plurality of pixel regions is formed in common with that provided for the another of the plurality of pixel regions, and the bank film is comprised of at least one inorganic material layer and has the side wall thereof sloped at an angle less than 85 degrees with respect to the principal surface of the substrate, wherein the bank film is formed of a silicon nitride film ($SiN_x$), wherein the silicon nitride film is comprised of a plurality of layers laminated above the principal surface of the substrate, composition ratio of nitrogen x in the plurality of layers is different from each other to decrease an etching rate of the silicon nitride film as closer to the principal surface of the substrate.

5. The organic EL display device comprising:

a substrate; and a plurality of pixel regions arranged in a principal surface of the substrate, respective one of plurality of pixel regions has a first electrode, a bank film, a light emitting material layer, and a second electrode stacked in this order above the principal surface of the substrate, wherein the bank film spaces the first electrode provided for the respective one of the plurality of pixel regions from that provided for another of the plurality of pixel regions adjacent to the respective one of the plurality of pixel regions, the second electrode is formed in common with the plurality of pixel regions, the bank film has an opening exposing a part of an upper surface of the first electrode toward the light emitting material layer and a side wall located along the opening, the light emitting material layer is formed in the opening of the bank film and in the vicinity thereof, and the bank film is comprised of at least one inorganic material layer and has the side wall thereof inclined at an angle less than 85 decrees with respect to the principal surface of the substrate, wherein the bank film is formed of a silicon nitride film ($SiN_x$), wherein a composition ratio of nitrogen x of the silicon nitride film is different between a lower side of the silicon nitride film located closer to the principal surface of the substrate and an upper side thereof further from the principal surface of the substrate opposed to the lower side thereof to decrease an etching rate thereof at the lower side thereof in comparison with that at the upper side thereof.

6. The organic EL display device according to claim 5, wherein the side wall of the bank film is shaped into a curvature extended from an upper surface of the first electrode to an upper surface of the bank film.

7. The organic EL display device according to claim 5, wherein the side wall of the bank film is partially sloped at an angle not less than 85 degrees with respect to the principal surface of the substrate between an upper surface of the first electrode to an upper surface of the bank film.

8. The organic EL display device according to claim 4, wherein the side wall of the bank film is shaped into a curvature extended from an upper surface of the first electrode to an upper surface of the bank film.

9. The organic EL display device according to claim 4, wherein the side wall of the bank film is partially sloped at an angle not less than 85 degrees with respect to the principal surface of the substrate between an upper surface of the first electrode to an upper surface of the bank film.

10. The organic EL display device comprising:

a substrate; and a plurality of pixel regions arranged in a principal surface of the substrate, respective one of plurality of pixel regions has a first electrode, a bank film, a light emitting material layer, and a second electrode stacked in this order above the principal surface of the substrate, wherein the bank film spaces the first electrode provided for the respective one of the plurality of pixel regions from that provided for another of the plurality of pixel regions adjacent to the respective one of the plurality of pixel regions, the second electrode is formed in common with the plurality of pixel regions, the bank film has an opening exposing a part of an upper surface of the first electrode toward the light emitting material layer and a side wall located along the opening, the light emitting material layer is formed in the opening of the bank film and in the vicinity thereof, and the bank film is comprised of at least one inorganic material layer and has the side wall thereof inclined at an angle less than 85 degrees with respect to the principal surface of the substrate, wherein the bank film is formed of a silicon nitride film ($SiN_x$), wherein the silicon nitride film is comprised of a plurality of layers laminated above the principal surface of the substrate, composition ratio of nitrogen x in the plurality of layers is different from each other to decrease an etching rate of the silicon nitride film as closer to the principal surface of the substrate.

11. The organic EL display device according to claim 10, wherein the side wall of the bank film is shaped into a curvature extended from an upper surface of the first electrode to an upper surface of the bank film.

12. The organic EL display device according to claim 10, wherein the side wall of the bank film is partially sloped at an angle not less than 85 degrees with respect to the principal surface of the substrate between an upper surface of the first electrode to an upper surface of the bank film.

* * * * *